United States Patent [19]
Tanaka et al.

[11] 4,301,541
[45] Nov. 17, 1981

[54] NOISE ELIMINATING CIRCUIT

[75] Inventors: Koichi Tanaka, Tokyo; Kiyoshi Amazawa, Ohmiya, both of Japan

[73] Assignees: Nippon Electric Co., Ltd.; Clarion Co., Ltd., both of Tokyo, Japan

[21] Appl. No.: 58,167

[22] Filed: Jul. 17, 1979

[30] Foreign Application Priority Data

Jul. 17, 1978 [JP] Japan .................................. 53-87346

[51] Int. Cl.$^3$ .............................................. H04B 1/10
[52] U.S. Cl. .................................... 455/221; 455/222; 455/312; 328/165
[58] Field of Search ................ 179/1 P; 455/218, 219, 455/221, 222, 223, 225, 297, 212, 312; 328/165

[56] References Cited

U.S. PATENT DOCUMENTS

| | | | |
|---|---|---|---|
| 3,188,571 | 6/1965 | Michael | 325/402 |
| 3,213,372 | 10/1965 | Kurvits | 325/478 |
| 3,325,738 | 6/1967 | Busby et al. | 325/478 |
| 3,805,166 | 4/1974 | Paredes | 325/478 |
| 4,044,309 | 8/1977 | Smith | 325/478 |

*Primary Examiner*—Jin F. Ng
*Attorney, Agent, or Firm*—Blanchard, Flynn, Thiel, Boutell & Tanis

[57] ABSTRACT

A noise eliminating circuit capable of detecting a frequency component largely contained in a pulsive noise from an input signal and cutting off a signal path upon detection of such a frequency component for eliminating the pulsive noise, which circuit is characterized by means for keeping the signal path cut off for the duration when the input signal exceeds a preset level.

4 Claims, 9 Drawing Figures

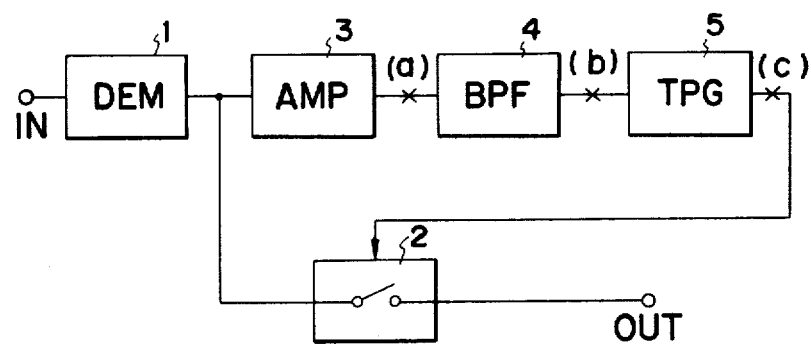
FIG. 1 PRIOR ART
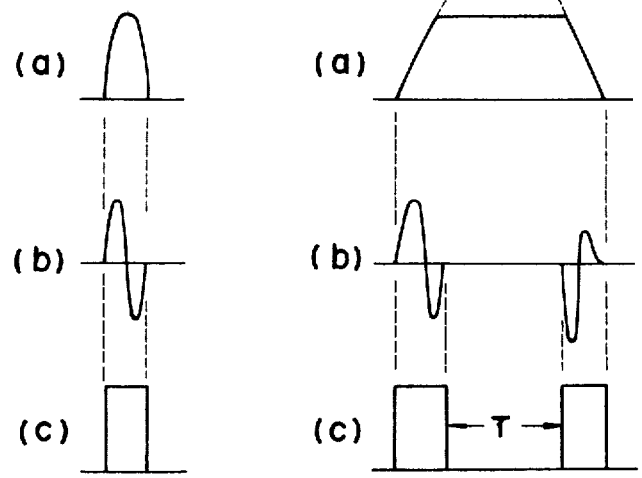
FIG. 2 PRIOR ART
FIG. 3

NOISE ELIMINATING CIRCUIT

This invention relates to a circuit for eliminating pulsive noise contained in an input signal and more particularly to a circuit of this type suitably employable for an AM or FM receiver mounted in a car.

There has been known a circuit capable of eliminating, in a demodulation operation, pulsive noise caused for example by spark ignition in an engine when the pulsive noise interferes with an input signal. FIG. 1 illustrates a block diagram of the known circuit. More particularly, an input signal IN is demodulated by a demodulating circuit 1, and an audio output signal is led to an output OUT through a gate circuit 2. The audio output signal is partly bypassed and subjected to amplification by an amplifier 3. An output from the amplifier 3 is applied to a band pass filter 4 to extract a noise signal component therefrom. In general, pulsive noise includes a component of a frequency higher than that of an ordinary audio signal, and accordingly a pass band of the band pass filter 4 is set to such a frequency band. An output from the band pass filter 4 is applied to an input of a trigger pulse generator 5. The pulse generator 5 is adapted to generate a pulse of a given level as long as an input is supplied thereto. During the holding time of the pulse, the gate 2 is in the nonconducting state.

FIG. 2 is an operational waveform chart of the circuit illustrated in FIG. 1. Marks (a) to (c) indicate waveforms at points designated by the corresponding marks with x in FIG. 1. Stated illustratively, when a pulsive noise as illustrated in FIG. 2 (a) appears at the output of the amplifier 3, a waveform of high frequency component (a differentiated waveform) as illustrated in FIG. 2 (b) appears at the output of the band pass filter 4. During the interval, a gate control pulse illustrated in FIG. 2 (c) is outputted from the pulse generator 5.

The known circuit as mentioned above is of a rapid response type and has such a characteristic that is can afford an excellent operation when the interfering pulsive noise is relatively short, but it will possibly cause leakage of a noise signal into an output OUT when the amplitude of the noise is large and/or the holding time of the noise is relatively long. This phenomenon has been carefully studied by the inventors of the present invention and the following facts have been revealed: when a pulsive noise of large amplitude and/or considerable length enters the input of the circuit, the amplifier 3 is caused to saturate and the output thereof has a trapezoidal waveform as illustrated in FIG. 3 (a); as a result, a high frequency component appearing at the output of the band pass filter 4 is as illustrated in FIG. 3 (b); and therefore the gate control pulse outputted by the pulse generator 5 is divided into two pulses as illustrated in FIG. 3 (c), so that the gate circuit 2 is conductive during the time interval T.

It is therefore an object of the present invention to provide a noise eliminating circuit which is free from the disadvantage of the known circuit.

Another object of the present invention is to provide a noise eliminating circuit which is capable of keeping a gate circuit operative without intermission against a noise of large amplitude and/or long duration to enable accurate cutout of noises.

The invention is characterized by a level detecting circuit for detecting a voltage (or current) higher than a preset level which appears at an input and continuously supplying a signal to an input of a pulse generating circuit for the duration when the voltage (or current) lasts.

There is already known a circuit for cutting off a signal path to eliminate a noise upon detection of a signal of a level higher than a preset level, which preset level is selected to have a value higher than a maximum level of an audio signal. However, the circuit itself cannot respond rapidly and, in addition, it cannot operate effectively against a noise of short duration. In this respect, the present invention can provide a noise eliminating circuit operative effectively against a noise of large amplitude and/or long duration without spoiling an excellent feature given by the detection of a component of a frequency largely contained in a pulsive noise by a band pass filter.

The invention is applicable to an FM receiver as well as an AM receiver.

The invention will be better understood from the following description taken in connection with the accompanying drawings in which:

FIG. 1 is a block diagram of a known circuit;

FIG. 2 is an operational waveform chart of the known circuit with respect to a short pulsive noise;

FIG. 3 is an operational waveform chart of the known circuit with respect to a long pulsive noise;

Figure 4:
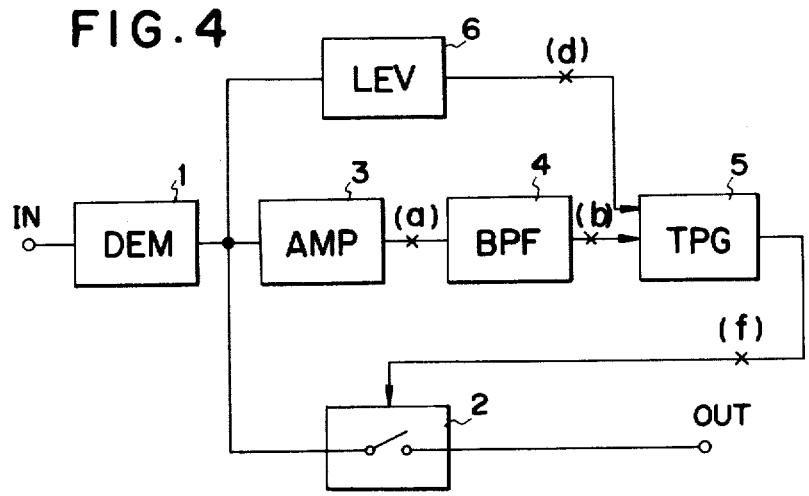
FIG. 4 is a block diagram of a noise eliminating circuit embodying the present invention.

Referring now to the drawings, there is illustrated a preferred embodiment of the invention. FIG. 4 illustrates a block diagram of a noise eliminating circuit embodying the invention. An input signal is led to a demodulating circuit 1. From an input IN an output of the demodulating circuit 1 is coupled to an output OUT through a gate circuit 2. Another output of the demodulating circuit 1 is coupled to a band pass filter 4 through an amplifier 3 and an output of the band pass filter 4 is coupled to an input of a trigger pulse generator 5. Still another output of the demodulating circuit 1 is connected to an input of a level detecting circuit 6 whose output is coupled to another input of the trigger pulse generator 5. An output of the trigger pulse generator 5 is connected to a control input of the gate circuit 2.

In the arrangement of the circuit as mentioned above, it will be seen that in a normal state when no noise enters, the gate circuit 2 is conducting and an output of the demodulating circuit 1 appears at the output OUT. On the other hand, when a pulsive noise interferes with an input signal, an output signal appears at the output of the band pass filter 4 in response to the pulsive noise in a similar manner to that of the known circuit illustrated in FIG. 1 and the trigger pulse generator 5 is driven to produce an output pulse during the appearance of the output of the filter 4. A pulse outputted from the pulse generator 5 controls the gate circuit 2 so as to cease conducting. During this interval, no signal appears at the output OUT and the noise is eliminated.

Figure 5:
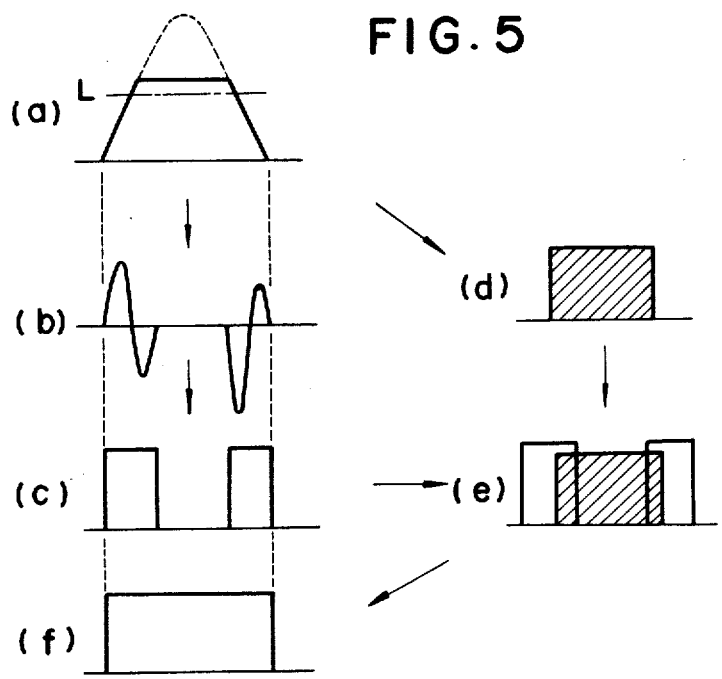
FIG. 5 is an explanatory view of operation of the circuit illustrated in FIG. 4.

Now is discussed a case where a noise of large amplitude and/or long duration interferes with an input signal. FIGS. 5 (a) to (f) illustrate waveforms at points designated by the corresponding marks with "x" in FIG. 4.

When a noise of large amplitude and/or long duration enters in the input signal at the input IN, the amplifier 3 is caused to saturate and the output waveform therefrom is as illustrated by the solid line in FIG. 5 (a). In this state, the output of the band pass filter 4 is as illustrated in FIG. 5 (b) and the control pulse formed therefrom is divided as illustrated in FIG. 5 (c) in a similar manner as described in relation with FIGS. 1 and 3.

The level detecting circuit 6 is adapted to produce an output for driving the trigger pulse generator 5 as long as an input thereto exceeds a preset level. The preset level corresponds to a level indicated by the chain dotted line (FIG. 5(a)) and is preferably set at a level slightly lower than the level at which the amplifier 3 is saturated. In this connection it is to be noted that the waveform of FIG. 5 (a) is taken at the output of the amplifier 3 and the detecting level of the level detecting circuit 6 should be considered as an input level of the amplifier 3 corresponding to the level L. As long as the input to the level detecting circuit 6 exceeds the preset level, an output as illustrated in FIG. 5 (d) is generated from the output end thereof. The output shown in FIG. 5 (d) is applied to the trigger pulse generator 5 together with the output signal from the band pass filter 4. As a result, the trigger pulse generator 5 is triggered during the time period as illustrated in FIG. 5 (e), and a pulse illustrated in FIG. 5 (f), which lasts from the beginning of the noise to the end thereof, appears at the output thereof. The gate circuit 2 is controlled by the pulse and is turned off for the duration of the pulse. Thus, no noise appears at the output OUT.

Figure 6:
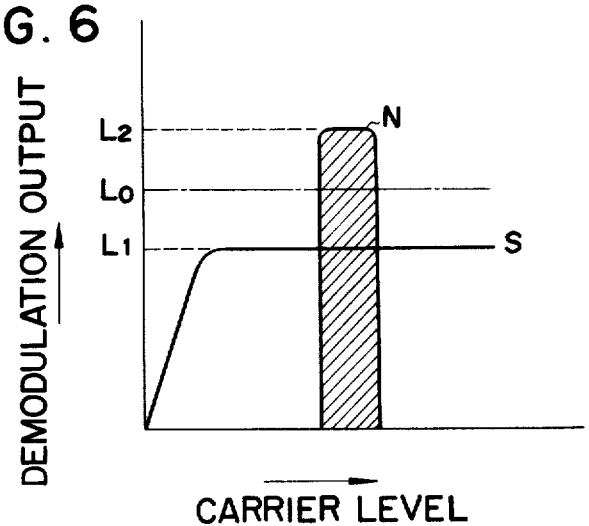
FIG. 6 is an explanatory view of level setting of the level detecting circuit.

The setting of the level to be detected by the level detecting circuit 6 will be more specifically explained referring to FIG. 6. FIG. 6 illustrates outputs of the demodulating circuit 1 relative to a carrier level of an input signal at the input IN. As to a signal S, when the carrier level is increased, AGC operates so that the demodulating output is maintained at a given level $L_1$ and does not exceed that level. As to a noise N, since the duration thereof is relatively short, AGC does not operate and the output from the demodulating circuit 1 is raised to a saturating level $L_2$. Accordingly, it is preferred that the detection level by the level detecting circuit 6 be set for example at a position of $L_0$ intermediate the levels $L_1$ and $L_2$.

Figure 7:
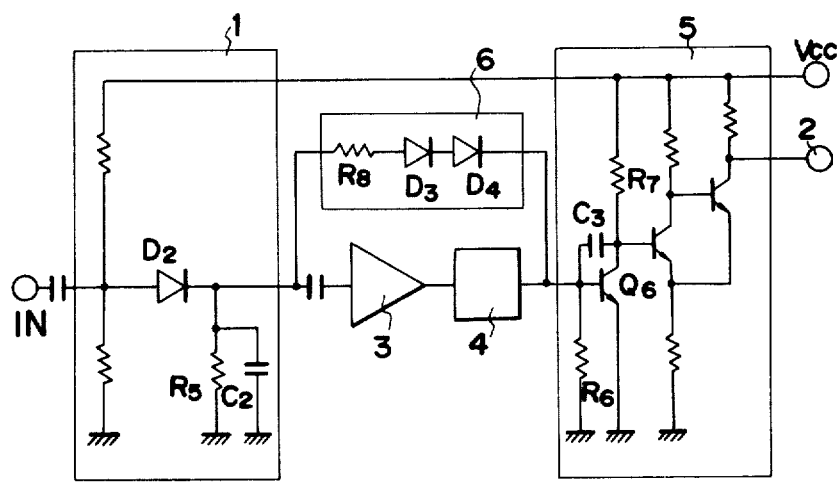
FIG. 7 is a specific circuit diagram of a noise eliminating circuit in accordance with the invention.

FIG. 7 shows a specific example of the noise eliminating circuit embodying the present invention. This circuit is suitable for being made of discrete component parts. The level detecting circuit 6 is formed of a series circuit of two diodes $D_3$ and $D_4$ and a resistor $R_8$. When the output of the demodulating circuit 1 exceeds a given level, the diodes $D_3$ and $D_4$ conduct and a current is supplied directly to the input of the trigger pulse generator 5.

Figure 8:
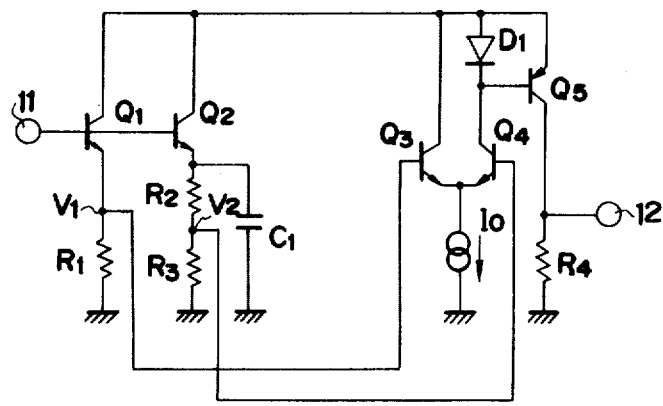
FIG. 8 is another specific circuit diagram of a noise eliminating circuit in accordance with the invention, showing only a principal portion thereof.

FIG. 8 illustrates a principal portion of another specific example of the noise eliminating circuit. This example is suitable for being a semiconductor integrated circuits containing a demodulating circuit, a level detecting circuit and a trigger pulse generator. To a terminal 11 is supplied an input modulated signal corresponding to the input signal at the input IN of FIG. 1). From a terminal 12 is produced a trigger pulse (corresponding to the output from the trigger pulse generator 5 in FIG. 1). Transistors $Q_1$ and $Q_2$ and transistors $Q_3$ and $Q_4$ are transistors of the same type, respectively. The terminal 11 is connected in common to the bases of the transistors $Q_1$ and $Q_2$. A resistor $R_1$ is inserted between the emitter of the transistor $Q_1$ and the ground. A series circuit of resistors $R_2$ and $R_3$, and a capacitor $C_1$, are connected between the emitter of the transistor $Q_2$ and the ground. On the other hand, the transistors $Q_3$ and $Q_4$ are connected to each other with their emitters connected in common to each other and have a constant current circuit $I_0$ inserted between their emitters and the ground. The base of the transistor $Q_3$ is connected to the emitter of the transistor $Q_1$ and the base of the transistor $Q_4$ is connected to a resistor divided point of the emitter circuit of the transistor $Q_2$.

The transistors $Q_3$ and $Q_4$ function as a differential current switch circuit. The operational state of the differential current switch circuit is detected by a diode $D_1$ and a resultant signal is taken out from the terminal 12 by a transistor $Q_5$.

Figure 9:
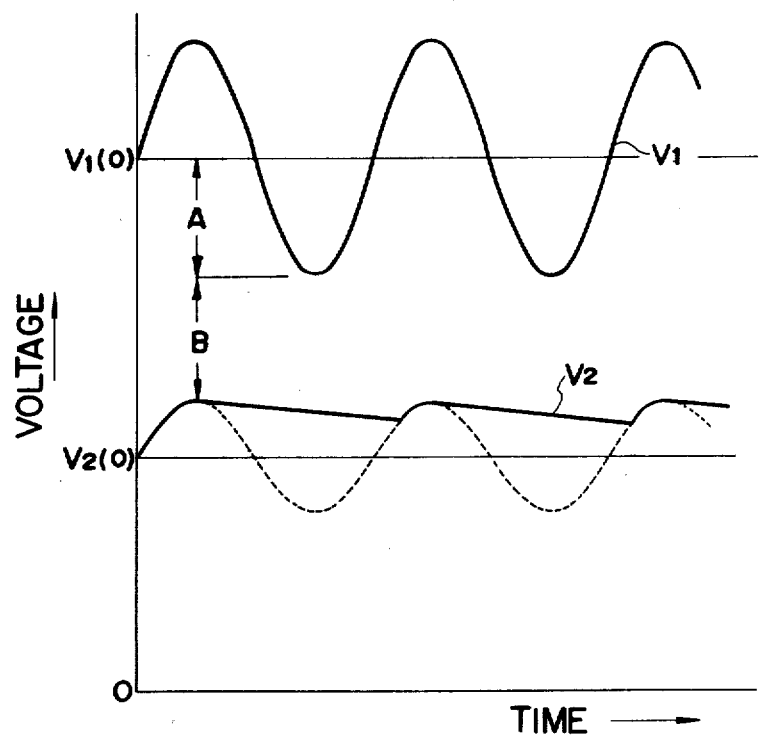
FIG. 9 is a waveform chart for explanation of the operation of the circuit illustrated in FIG. 8.

In this arrangement, since the transistors $Q_1$ and $Q_2$ are the same type transistors and their bases are in common, potentials appearing at their emitters are equal to each other. However, since the capacitor $C_1$ is connected to the emitter of the transistor $Q_2$, the input signal at the terminal 11 is subjected to the envelope detection so as to obtain an envelope of its carrier at the emitter of the transistor $Q_1$. Therefore, the waveforms of voltages $V_1$ and $V_2$ in FIG. 8 are as illustrated in FIG. 9. More particularly, the voltage $V_1$ assumes a waveform (sinusoidal the case as illustrated) of a carrier, starting at a value $V_{1(0)}$ when the carrier is zero. On the other hand, the voltage $V_2$ assumes an envelope of a carrier waveform starting at a value $V_{2(0)}$ when the carrier is zero.

Therefore, as can be seen from FIG. 9, since the circuit is designed to maintain a relation $V_1 > V_2$ so long as no noise enters, the transistor $Q_3$ is in a conducting state and the transistor $Q_4$ is in the nonconducting state.

When a pulsive noise of large amplitude is supplied to the input terminal 11, and the output voltage $V_1$ at the emitter of the transmitter $Q_1$ exceeds the normal amplitude A and increases to an amplitude A+B. Therefore, the above-mentioned relation is inverted to $V_1 < V_2$ since the voltage $V_2$ is substantially constant due to the function of the capacitor $C_1$. At this time, the differential switch circuit formed of the transistors $Q_3$ and $Q_4$ inverts its operational condition. Then, a current $I_0$ all flows into the transistor $Q_4$, setting up a voltage across the diode $D_1$. The transistor $Q_5$ then conducts to feed a pulse to the terminal 12 which is applied to a gate (which is not shown in FIG. 8, but which corresponds to the gate circuit 2 in FIG. 4).

If the amplitude of the voltage $V_1$ is varied violently by a noise, the relations $V_1 > V_2$ and $V_1 < V_2$ alternate violently. This may be suitably smoothed by a time constant of the switch circuit formed of the transistors $Q_3$ and $Q_4$ or a time constant of a gate circuit connected to the terminal 12.

FIG. 8 and the above-mentioned relation between A and B can be quantitatively expressed as follows:

$$B = V_{1(0)} \cdot R_2/(R_2 + R_3) - A$$

The amplitude detection level may be determined from this equation.

The circuit of FIG. 6 may be effectively utilized also for an FM signal before demodulation.

As mentioned above, in accordance with the invention, the gate circuit can continuously operate without intermission against a noise of large amplitude and/or long duration to effectively cut out the noise. The noise eliminating circuit of this invention has an excellent effect when applied to a car AM/FM radio receiver which suffers from serious noise due to sparking in an engine.

We claim:

1. A noise eliminating circuit comprising:
   input means for receiving an input signal which includes an information component and a noise component, said input means being responsive to said input signal for producing a first output which includes both of said components;
   noise detecting means coupled to said input means and responsive to said first output for producing a second output in response to a frequency component of said noise component, said noise detecting means having the characteristic that its operation is interrupted when said noise component is of large amplitude and/or long duration;
   level detecting means coupled to said input means for producing a third output when said noise component is of large amplitude sufficient to interrupt operation of said noise detecting means;
   pulse generation means coupled to said noise detecting means and said level detecting means for producing a pulse in response to said second output and said third output whereby to provide a continuous pulse for the duration of a pulse of said noise component;
   output means coupled to said input means for deriving said information component; and
   gate means coupled to said input means and said output means and coupled for operation by a pulse from said pulse generation means for preventing said first output from being transmitted from said input means to said output means during the period when said pulse generation means produces said pulse, thereby eliminating said noise component of said input signal.

2. A noise eliminating circuit as claimed in claim 1, wherein said noise detecting means includes a band pass filter.

3. A noise eliminating circuit as claimed in claim 1 or claim 2, wherein said noise detecting means further includes a noise amplifier which has the characteristic that it becomes saturated when said noise component is of large amplitude, and said level detecting means produces said third output before the level of said noise component exceeds the level at which said noise component causes said noise amplifier to saturate.

4. A noise eliminating circuit for a radio receiver having noise eliminating gate means comprising:
   demodulating means for demodulating an input signal containing an information component and pulsive noise components to provide an audio output signal containing an information signal and pulsive noise signals;
   noise detecting means for detecting said pulsive noise signals in said audio output signal, said noise detecting means comprising an amplifier for amplifying said audio output signal of said demodulating means and band pass filter means for extracting said pulsive noise signal from the output of said amplifier to provide a first noise output signal, said amplifier having the characteristic that it becomes saturated when said pulsive noise signals are of large amplitude, said noise detecting means also comprising a level detector for detecting the level of said pulsive noise signal of said audio output signal from said demodulating means and providing a continuous second noise output signal for as long as the level of said pulsive noise signal of said audio output signal from said demodulating means exceeds the level at which said amplifier is saturated so as to detect said pulsive noise signals of large amplitude and/or long duration; and
   trigger pulse generator means for producing a gate control signal to said noise eliminating gate means in response to said first and second noise output signals so that said noise eliminating gate means is turned off for the durations of pulsive noise signals in said audio output signal.

* * * * *